(12) United States Patent
Wu

(10) Patent No.: US 8,614,504 B2
(45) Date of Patent: Dec. 24, 2013

(54) CHIP PACKAGE AND METHOD FOR MAKING SAME

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 28 days.

(21) Appl. No.: 13/284,978

(22) Filed: Oct. 30, 2011

(65) Prior Publication Data

US 2013/0049233 A1   Feb. 28, 2013

(30) Foreign Application Priority Data

Aug. 25, 2011   (TW) .............................. 100130586 A

(51) Int. Cl.
*H01L 23/02* (2006.01)

(52) U.S. Cl.
USPC .................... 257/678; 257/E23.128; 438/118; 438/119

(58) Field of Classification Search
USPC .................. 257/783, E21.514, 678, E23.128; 438/118, 119
See application file for complete search history.

(56) References Cited

U.S. PATENT DOCUMENTS

| | | | | |
|---|---|---|---|---|
| 5,444,301 A | * | 8/1995 | Song et al. | 257/737 |
| 6,265,782 B1 | * | 7/2001 | Yamamoto et al. | 257/783 |
| 2008/0001240 A1 | * | 1/2008 | Minamio et al. | 257/434 |

* cited by examiner

*Primary Examiner* — Amar Movva
(74) *Attorney, Agent, or Firm* — Altis Law Group, Inc.

(57) ABSTRACT

A chip package includes a substrate, a pad, a double-sided adhesive tape, a chip, and a sealing member. The pad is arranged on the substrate and has a top surface facing away from the substrate. The double-sided adhesive tape includes a first paste surface and an opposing second paste surface. The first paste surface is attached to the top surface. The chip is attached onto the second paste surface and includes a light emitting surface or a light receiving surface facing away from the second paste surface. The sealing member is formed on the pad and tightly surrounds the chip and the double-sided adhesive.

16 Claims, 3 Drawing Sheets

CHIP PACKAGE AND METHOD FOR MAKING SAME

BACKGROUND

1. Technical Field

The present disclosure relates to a chip package and a method for making such chip package.

2. Description of Related Art

In accordance with the trend of miniaturizing electronic apparatuses, attempts are being made to pack more than one chip into a package in order to achieve a high density of the package. Generally, the chips are attached onto a pad on a printed circuit board with glue. During packaging of the chips, it is difficult to control the amount of the glue applied. If insufficient glue is used, the chip may not properly adhere to the pad and may easily be detached, which may cause complete failure of the chip package. On the other hand, if excessive glue is used, the glue may overflow to other places and negatively influence other elements. In addition, as the glue flows, it may shift the chips from their original locations before the glue is solidified.

Therefore, it is desirable to provide a chip package and a method for making such chip package, which can overcome or at least alleviate the limitations described.

DETAILED DESCRIPTION

Figure 1:
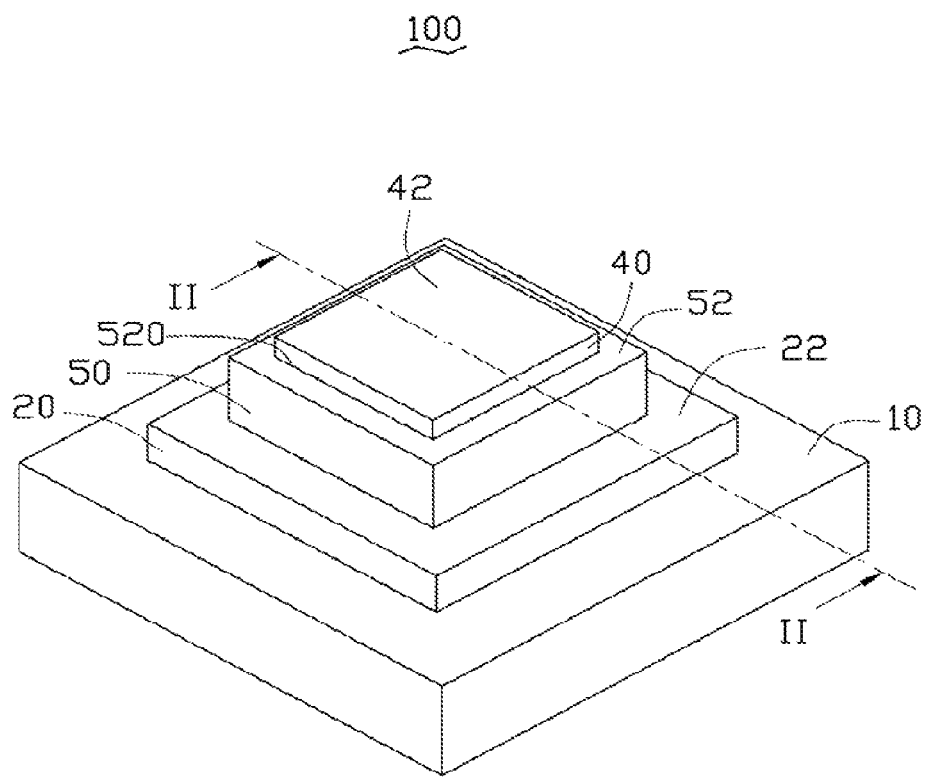
FIG. 1 is an isometric view of a chip package, according to a first exemplary embodiment.
Figure 2:
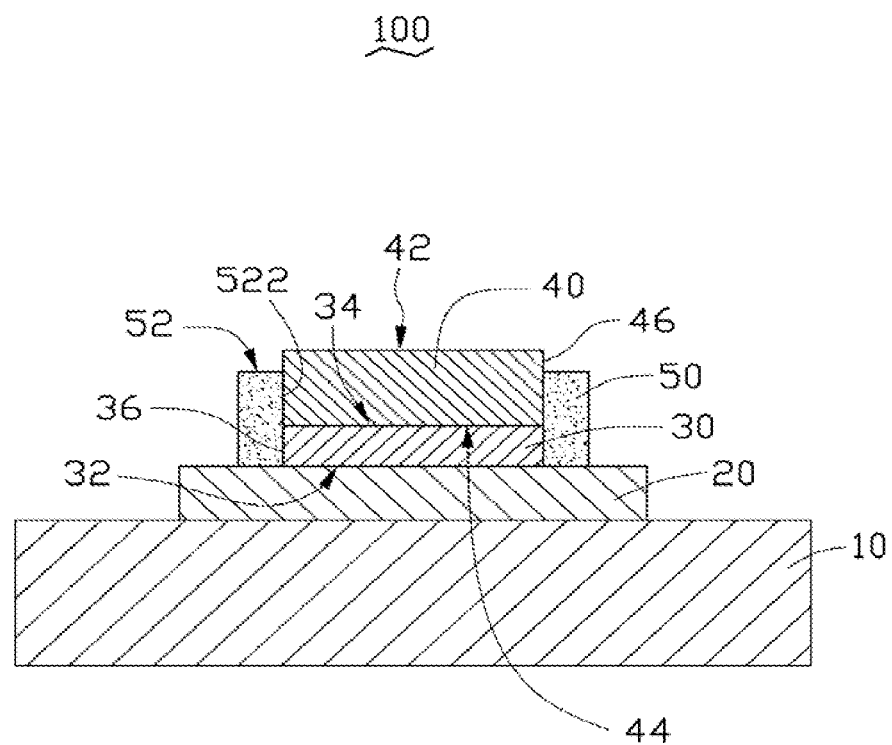
FIG. 2 is a sectional view of the chip package of FIG. 1, taken along line II-II thereof.

Referring to FIGS. 1-2, a chip package 100, according to a first exemplary embodiment, includes a substrate 10, a pad 20, a double-sided adhesive tape 30, a chip 40, and a sealing member 50.

In this embodiment, the substrate 10 is a circuit board. A number of circuits are distributed on the substrate 10 and are configured for driving and/or controlling the chip 40.

The pad 20 is made of conductive metal, such as copper, nickel, gold or silver. The pad 20 is arranged on the substrate 10 by soldering. The pad 20 includes a top surface 22 facing away from the substrate 10.

The double-sided adhesive tape 30 includes a first paste surface 32, a second paste surface 34, and four first outer side surfaces 36. The first paste surface 32 and the second paste surface 34 are positioned at opposite skies of the double-sided adhesive tape 30. The four first outer side surface 36 connect each other end-to-end and are interconnected between the first paste surface 32 and the second paste surface 34. The first paste surface 32 is attached to the top surface 22 of the pad 20.

The chip 40 is used in an optical coupling connector. In this embodiment, the chip 40 is a laser diode and includes a light emitting surface 42, a bottom surface 44, and four second outer side surfaces 46. The light emitting surface 42 and the bottom surface 44 are positioned at opposite sides of the double-sided adhesive tape 30. The four second outer side surfaces 46 connect each other end-to-end and are interconnected between the light emitting surface 42 and the bottom surface 44. The bottom surface 44 is attached onto the second paste surface 34, and the light emitting surface 42 faces away from the second paste surface 34. The chip 40 is electrically connected to the top surface 22 by wires (not shown), thereby electrically connecting the chip 40 to the substrate 10. In this embodiment, the chip 40 is a rectangular microchip, and the dimensions of the chip 40 are about 200×200 microns. The dimensions of the double-sided adhesive tape 30 are greater than or equal to those of the chip 40. The pad 20 is longer and wider than the chip 40. In alternative embodiments, the chip 40 may be a photo diode, and the chip 40 includes a light receiving surface 42 facing away from the second paste surface 34.

The material of the sealing member 50 is epoxy resin. The sealing member 50 is formed on the pad 20 and is shaped to tightly surround the chip 40 and the double-sided adhesive tap 30. In this embodiment, the sealing member 50 is a rectangular plate defining a rectangular receiving hole 520. The receiving hole 520 includes four inner side surfaces 522 connecting each other end-to-end. The chip 40 and the double-sided adhesive tape 30 are received in the receiving hole 520. In particular, the inner side surfaces 522 tightly contact the first outer sick surfaces 36 and the second outer site surfaces 46. The height of the sealing member 50 is greater than that of the double-sided adhesive tape 30 and less than the total height of the chip 40 and the double-sided adhesive tape 30, and thus the light emitting surface 42 is exposed at the scaling member 50.

Figure 3:
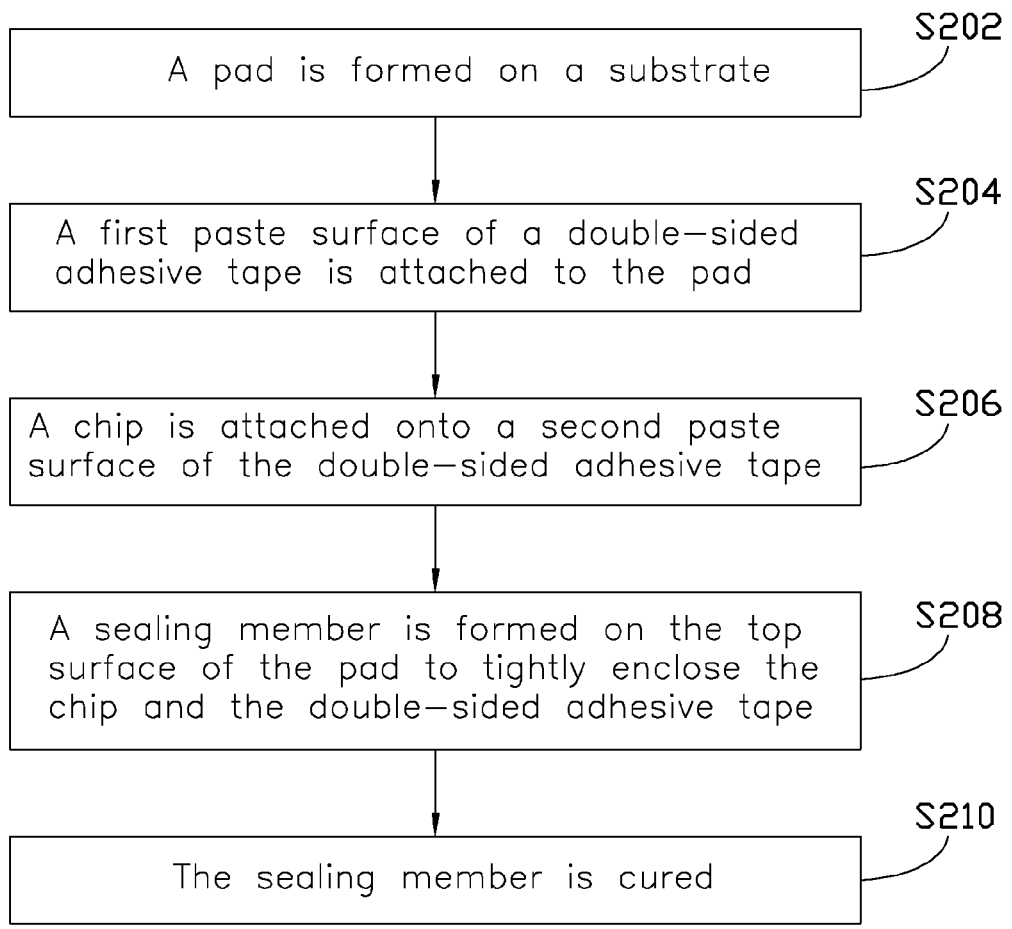
FIG. 3 is a flowchart of a method for making the chip package of FIG. 1, according to a second exemplary embodiment.

Referring to FIG. 3, a method for making the chip package 100, according to a second exemplary embodiment, includes steps S202 through S210. In step S202, a pad 20 is formed on a substrate 10. In step S204, a first paste surface 32 of a double-sided adhesive tape 30 is attached to the pad 20. In step S206, a chip 40 is attached onto a second paste surface 34 of the double-sided adhesive tape 30 and the light emitting surface 42 of the chip 40 faces away from the second paste surface 34. In step S208, a sealing member 50 is formed on the top surface 22 of the pad 20 to tightly enclose the chip 40 and the double-sided adhesive tape 30. In step S210, the sealing member 50 is cured.

During making the chip package 100, the chip 40 is attached onto the pad 20 by the double-sided adhesive tape 30 and is restricted by the sealing member 50, thereby easily fixedly attaching the chip 40 at a proper location on the pad 20 and avoiding shifting of the chip 40 with overflowing glue.

Although numerous characteristics and advantages of the present embodiments have been set forth in the foregoing description, together with details of the structures and functions of the embodiments, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A chip package comprising:
   a substrate;
   a pad arranged on the substrate and comprising a top surface facing away from the substrate;
   a double-sided adhesive tape comprising a first paste surface, a second paste surface opposite to the first paste surface, and four first outer side surfaces connecting each other end-to-end and interconnected between the first paste surface and the second paste surface, the first paste surface attached to the top surface;
   a chip attached onto the second paste surface, the chip comprising to light emitting surface facing away from the second paste surface, a bottom surface opposite to the light emitting surface, and four second outer side surfaces connecting each other end-to-end and interconnected between the bottom surface and the light emitting surface; and a sealing member formed on the top surface of the pad and tightly surround the chip and the double-sided adhesive tape, the sealing member defining a rectangular receiving hole, the receiving hole comprising four inner side surfaces connecting each other end-to-end, the inner side surfaces tightly contacting the first outer side surfaces and the second outer side surfaces, the height of the sealing member is greater than that of the double-sided adhesive tape and less than the total height of the chip and the double-sided adhesive tape.

2. The chip package of claim 1, wherein the pad is made of a conductive metal selected from a group consisting of copper, nickel, gold, and silver.

3. The chip package of claim 1, wherein the chip is a laser diode.

4. The chip package of claim 1, wherein the pad is arranged on the substrate by soldering.

5. The chip package of claim 1, wherein the dimensions of the double-sided adhesive tape are greater than or equal to those of the chip.

6. The chip package of claim 1, wherein the chip is rectangular and the sealing member is a rectangular plate.

7. A method for making a chip package, the chip package comprising a substrate, a pad having a top surface, a double-sided adhesive tape having four first outer side surfaces, a chip having four second outer side surfaces, and a sealing member defining a receiving hole with four inner side surfaces, the method comprising:

forming the pad on the substrate with the top surface facing away from the substrate;

attaching the chip onto a second paste surface of the double-sided adhesive tape;

forming the sealing member on the top surface of the pad to tightly enclose the chip the double-sided adhesive tape, wherein the chip and the double-sided adhesive tape are located in the receiving hole, and the inner side surfaces tightly contact the first outer side surfaces and the second outer side surfaces;

and curing the sealing member, the height of the sealing member is greater than that of the double-sided adhesive tape and less than the total height of the chip and the double-sided adhesive tape.

8. The method for making a chip package of claim 7, wherein the pad is arranged on the substrate by soldering.

9. The method for making a chip package of claim 7, wherein the dimensions of the double-sided adhesive tape are greater than or equal to those of the chip.

10. The chip package of claim 7, wherein the chip is rectangular and the sealing member is a rectangular plate.

11. A chip package comprising:

a substrate;

a pad arranged on the substrate and comprising a top surface facing away from the substrate;

a double-sided adhesive tape comprising a first paste surface, a second paste surface opposite to the first paste surface, and four first outer side surfaces connecting each other end-to-end and interconnected between the first paste surface and the second paste surface, the first paste surface attached to the top surface;

a chip attached onto the second paste surface, the chip comprising a light receiving surface facing away from the second paste surface, a bottom surface opposite to the light receiving surface, and four second outer side surfaces connecting each other end-to-end and interconnected between the bottom surface and the light emitting surface; and a sealing member formed on the top surface of the pad and tightly surround the chip and the double-sided adhesive tape, the sealing member defining a rectangular receiving hole, the receiving hole comprising four inner side surfaces connecting each other end-to-end, the inner side surfaces tightly contacting the first outer side surfaces and the second outer side surfaces, the height of the sealing member is greater than that of the double-sided adhesive tape and less than the total height of the chip and the double-sided adhesive tape.

12. The chip package of claim 11, wherein the pad is made of a conductive metal selected from a group consisting of copper, nickel, gold, and silver.

13. The chip package of claim 11, wherein the chip is a photo diode.

14. The chip package of claim 11, wherein the pad is arranged on the substrate by soldering.

15. The chip package of claim 11, wherein the dimensions of the double-sided adhesive tape are greater than or equal to those of the chip.

16. The chip package of claim 11, wherein the chip is rectangular and the sealing member is a rectangular plate.

* * * * *